United States Patent [19]

Voegeli

[11] 4,001,796
[45] Jan. 4, 1977

[54] BUBBLE LATTICE STRUCTURE WITH BARRIER
[75] Inventor: Otto Voegeli, San Jose, Calif.
[73] Assignee: International Business Machines Corporation, Armonk, N.Y.
[22] Filed: June 16, 1975
[21] Appl. No.: 587,481

Related U.S. Application Data
[63] Continuation-in-part of Ser. No. 494,940, Aug. 5, 1974, Pat. No. 3,930,244.
[52] U.S. Cl. .................. 340/174 TF; 340/174 VA
[51] Int. Cl.² ....................................... G11C 11/14
[58] Field of Search ............................ 340/174 TF

[56] References Cited
UNITED STATES PATENTS
3,798,622 3/1974 O'Dell ...................... 340/174 TF
3,913,079 10/1975 Rosier ........................ 340/174 TF

*Primary Examiner*—James W. Moffitt
*Attorney, Agent, or Firm*—Joseph E. Kieninger

[57] ABSTRACT

A bubble lattice structure is disclosed containing a barrier positioned between at least two adjacent rows of bubble domains and/or stripe domains. More than one barrier may be utilized to retain integrity of the lattice. The bubble lattice structure containing barriers has a number of advantages or improved operating characteristics such as better control in maintaining the relative position of the bubble domains in the lattice columns adjacent the column of bubbles being accessed, closer control of the number of rows of bubbles in a given area, and a reduction of the distortion of the lattice during lateral translation.

14 Claims, 6 Drawing Figures

BUBBLE LATTICE STRUCTURE WITH BARRIER

This is a continuation-in-part of application Ser. No. 494,940 filed on Aug. 5, 1974 now U.S. Pat. No. 3,930,244.

BACKGROUND OF THE INVENTION

1. Field of the Invention

This invention relates to bubble domain lattices and more particularly to an improved bubble domain lattice structure.

2. Brief Description of Prior Art

Bubble domains and stripe domains arranged in a lattice are described in copending U.S. patent application Ser. No. 395,336 filed on Sept. 7, 1973 now abandoned and assigned to the assignee of the present invention. As described therein, the bubble domain lattice consists of a plurality of rows and columns of bubble domains and/or domain stripes which occupy a spatial arrangement which is determined to a substantial extent by the interaction between the bubbles. A bubble lattice initialization method is described in copending U.S. Patent application Ser. No. 517,990 filed on Oct. 25, 1974 now U.S. Pat. No. 3,953,842 and assigned to the assignee of the present invention. As described therein the method provides an initial lattice containing a plurality of rows of substantially perfect parallel stripe domains and bubble domains. The aforementioned applications are incorporated herewith by reference thereto.

It has been observed that several problems exist in the formation and operation of a bubble lattice device. One such problem occurs during the translation of bubbles in the access column from and to the input and output ports respectively. The current that is applied in the conductor pattern to move the bubbles in the access column has a tendency to also move the bubbles in the adjacent columns by an amount which is sufficient to disturb the integrity of the lattice.

Another problem pertains to obtaining a particular number of rows in the bubble lattice. The number of rows of bubbles and/or stripes domains in a lattice in a given area depends to a large extent on magnetic material parameters which are determined by the chemical composition and the growth conditions of the bubble material. For example, to obtain a lattice having 28 rows of bubble domains in a given space on a garnet film, it is necessary to closely control the chemical composition of the garnet film. Unless the chemical composition is closely controlled the number of rows in this example can vary quite easily from, for example, 27 to 32 rows. As a result it is necessary to closely control the material parameters to obtain the same number of rows with different films in a given area.

Still another problem that has been observed deals with the translation of the bubbles laterally in the rows. Bubbles having a $S=0$ state, that is, where there is one pair of Bloch lines in the walls of the domain, move in a direction of an applied field gradient while bubbles having a $S=1$ state, that is, when there are not Bloch lines in the wall of the domain, move at an angle to the gradient. Since the conductor lines used to provide the lateral propagation or movement of the bubbles are parallel to the columns and are not perpendicular to the bubble rows, both the $S=0$ and the $S=1$ state bubbles may have a component of force which is not in the direction of translation, i.e., the horizontal direction of the rows. This force may, at times, cause one or more of the bubbles to sway or deviate from the horizontal direction.

Another problem is observed during or after the formation of a substantially perfect array of parallel stripe domains. It has been observed that on occasion the stripes that are formed stripe out in a direction which is perpendicular to the conductor rather than along the horizontal direction of the row. These difficulties occur due to the magnetostatic interactions between stripes and bubbles in the adjacent column and because the gradient being applied is in the direction perpendicular to the conductor when the current is applied to it.

SUMMARY OF THE INVENTION

It is a primary object of this invention to provide an improved bubble lattice structure.

It is another primary object of the present invention to provide a stable bubble domain lattice arrangement.

It is another object of this invention to provide a bubble lattice structure suitable for improved column accessing operations.

It is still another object of this invention to provide a bubble lattice structure which maintains the integrity of the lattice in columns that are adjacent to the access columns.

It is yet another object of this invention to provide a structure with a given number of rows in a given area.

It is yet still another object of this invention to provide a bubble lattice structure which permits magnetic material parameters to vary somewhat while still obtaining a given number of rows in a given area.

It is another object of this invention to provide a structure which reduces or inhibits the skew movement of bubbles during horizontal translation.

It is a final object of this invention to provide a bubble lattice system which assures the integrity of the substantially perfect lattice array of bubble domains and/or stripe domains during and after formation.

These and other objects are accomplished by the use of one or more barriers being positioned in a lattice between the rows of bubbles. An example would be a bubble lattice containing 16 rows of bubbles and stripe domains. Three barriers would be used by positioning one barrier every fourth row. The barriers would extend from one side of the lattice to the other side and have openings therein at columns which are used to access or move the bubbles from or to the input/output ports where the bubbles are inserted or extracted from the lattice.

Other objects of this invention will be apparent from the following detailed description reference being made to the accompanying drawings wherein various embodiments of the bubble lattice structure containing barriers are shown.

DESCRIPTION OF THE ILLUSTRATIVE EMBODIMENTS

Figure 1:
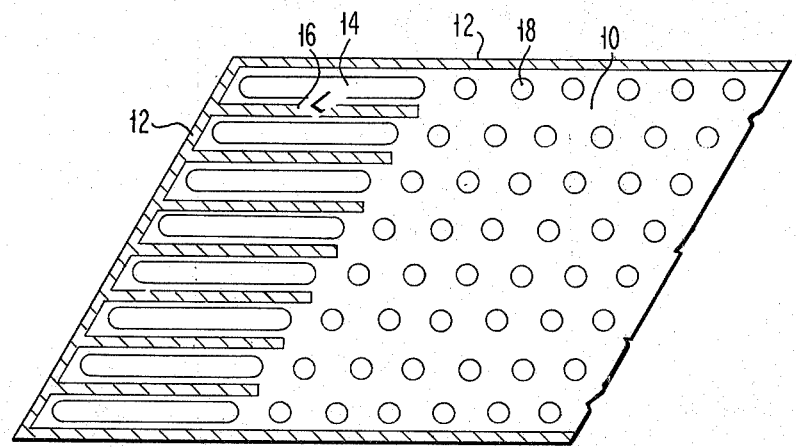
FIG. 1 is a top view of a lattice containing barriers between rows of stripe domains at the end of the lattice.
Figure 6:
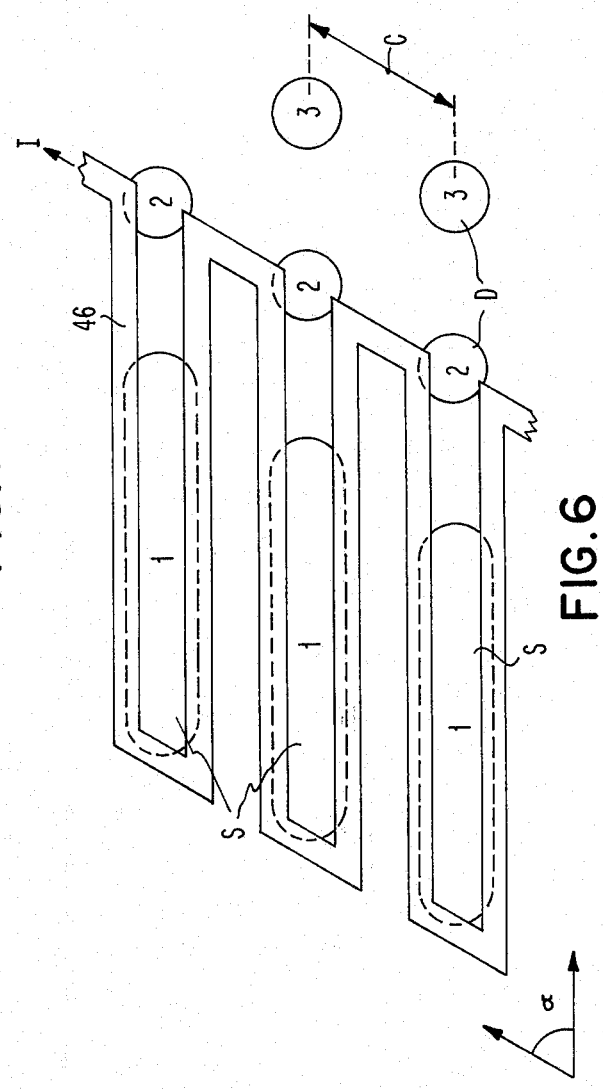
FIG. 6 illustrates one embodiment of a stripe domain length adjusting means usable in the arrangement shown in FIG. 1.

As shown in FIG. 1, the lattice 10 is contained by a retaining means 12. Along one end of the lattice 10 are a column of stripe domains 14. Positioned between the stripe domains 14 in accordance with this invention are barriers 16. The barriers 16 may be a dam, a groove, or an equivalent retaining means. A dam can be an area of increased film thickness. A groove is an area of decreased film thickness. Grooves can be used that are empty or they may contain bubble domains and/or stripe domains. Other equivalent retaining means which may be used as barriers are current carrying conductors as shown in FIG. 6, ion implanted regions, silicon diffused regions, permalloy patterns and material defect regions.

As shown in FIG. 1 the barrier 16 is positioned beside every row, that is, it is positioned between two stripe domains 14 so that every stripe domain 14 is separated from another stripe domain 14 by barrier 16. Positioning one barrier 16 for every row containing a stripe domain 14 provides maximum integrity to the stripe domain portion of the lattice. The barrier 16 may be positioned every one to sixteen rows. The preferred range is every one to four rows. In general, placing the barrier in large lattices so that the barrier is positioned more than 16 rows does not provide sufficient integrity for the lattice most of the time.

Figure 2:
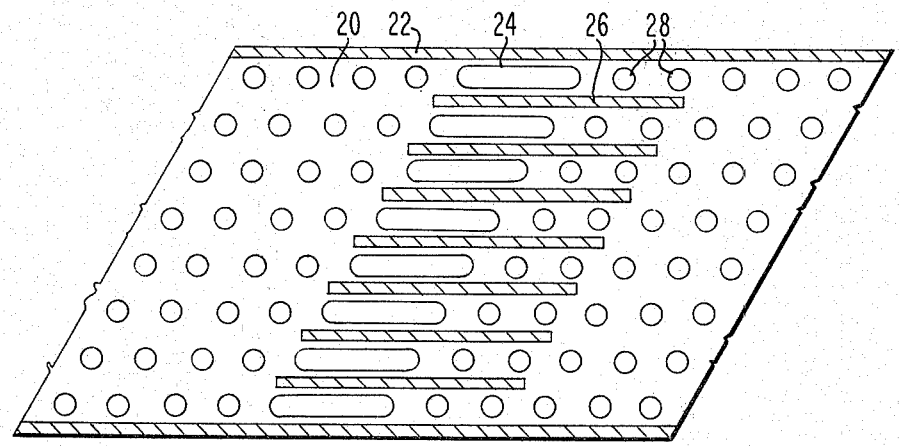
FIG. 2 is a top view of a lattice containing barriers positioned between rows of stripe domains and bubble domains in the middle of the lattice.

In FIG. 2 a bubble lattice 20 is contained by retaining means 22. Positioned away from the ends of the lattice are stripe domains 24. Positioned between the stripe domains 24 and two columns of bubble domains 28 are barriers 26 which retain the integrity of the lattice. FIG. 2 is similar to FIG. 1 with respect to the relationship between the stripe domains 24 and the barriers 26. One difference between FIG. 1 and FIG. 2 is the position of the stripe domains 24 and the barriers 26 being away from the ends in FIG. 2 whereas in FIG. 1 the stripe domains 14 and barriers 16 are adjacent one end. Another is that in FIG. 2 the barriers 26 separate both stripes and bubbles.

Figure 3:
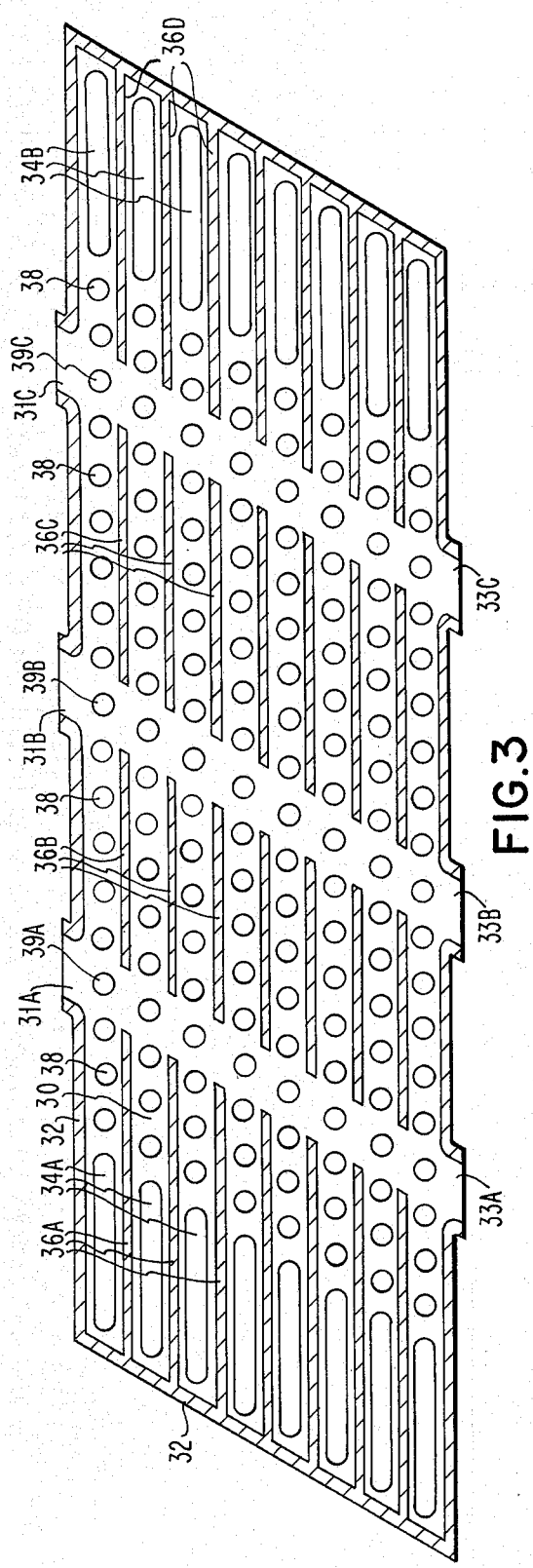
FIG. 3 is a top view of a lattice containing stripe domains and bubble domains with barriers positioned between adjacent rows and with openings in the barriers for the columns which access to the input and output ports.

In FIG. 3 a lattice 30 is confined by retaining means 32. Openings in the retaining means 32 are provided for input ports 31A, 31B and 31C as well as output ports 33A, 33B and 33C. The lattice contains a column of stripe domains 34A at one end of the lattice and a column of stripe domains 34B at the other end of the lattice. Positioned in rows between the columns of stripe domains 34A and 34B are bubble domains 38. Positioned in a column between the stripe domains 34A and 34B are barriers 36A and 36D, respectively. Positioned in a column between the various rows of bubbles 38 are barriers 36A, 36B, 36C and 36D. The barriers 36A, 36B, 36C and 36D are separated from each other by a space or access column in which a column of bubbles 39A, 39B and 39C, respectively, may be moved from input ports 31A, 31B and 31C into the lattice as well as from the lattice to output ports 33A, 33B and 33C.

The use of separated barriers in the same row adjacent to columns which are used for accessing is important in retaining the integrity of the lattice during the accessing of a column of bubbles. In the absence of separated barriers in the same row, the movement of bubbles in an access column without distorting the position of bubbles in the columns adjacent thereto is difficult. In general, if a driving force of sufficient strength to move the bubbles in the access column is provided, the bubbles adjacent thereto are also affected by the driving force and their relative position in the perfect lattice is somewhat distorted. The presence of barriers on either side of the access channel effectively maintains the adjacent bubbles in their relative position so that the accessing of bubbles does not disturb the integrity of the lattice.

The structure shown in FIG. 3 is also useful for presenting any bubbles from "swaying" or moving in a direction which is not horizontal. The interaction of the bubbles in combination with the barrier reduce any deviations from horizontal movement so that no problem of this type exists.

In FIG. 3 there is a barrier between each row of stripe domains and bubble domains. Such an extensive use of barriers provides maximum rigidity and/or integrity to the lattice. There are several factors which need to be considered in determining the spacing of the barriers. One factor is the width of the particular barrier being used. For example, devices fabricated with bubble material having a demagnetized strip width of 5 microns have dams which are about 4 microns wide whereas groove or grooves containing bubbles are about 8 microns wide. Another factor is the spacing of the bubbles in the lattice. Presently, the spacing is about 11.5 microns from center to center of the bubbles. Still another factor to be considered is the lithography processes used to make the barriers. Devices made with bubble material having a demagnetized strip width of 5 microns presently have a center to center spacing of bubbles in the lattice of about 11.5 microns. Still another factor to be considered is the lithography processes used to make barriers. Conventional photolithographic techniques and commercially available equipment are limited to forming masks and patterns with a linewidth of 2 microns or larger. This implies that when a barrier is used between a row of stripe domain and bubble domain the minimum spacing between bubbles in the lattice is approximately 11.5 microns. The spacing between bubbles may be decreased by using a barrier between every two or more stripe and bubble domains.

Figure 4:
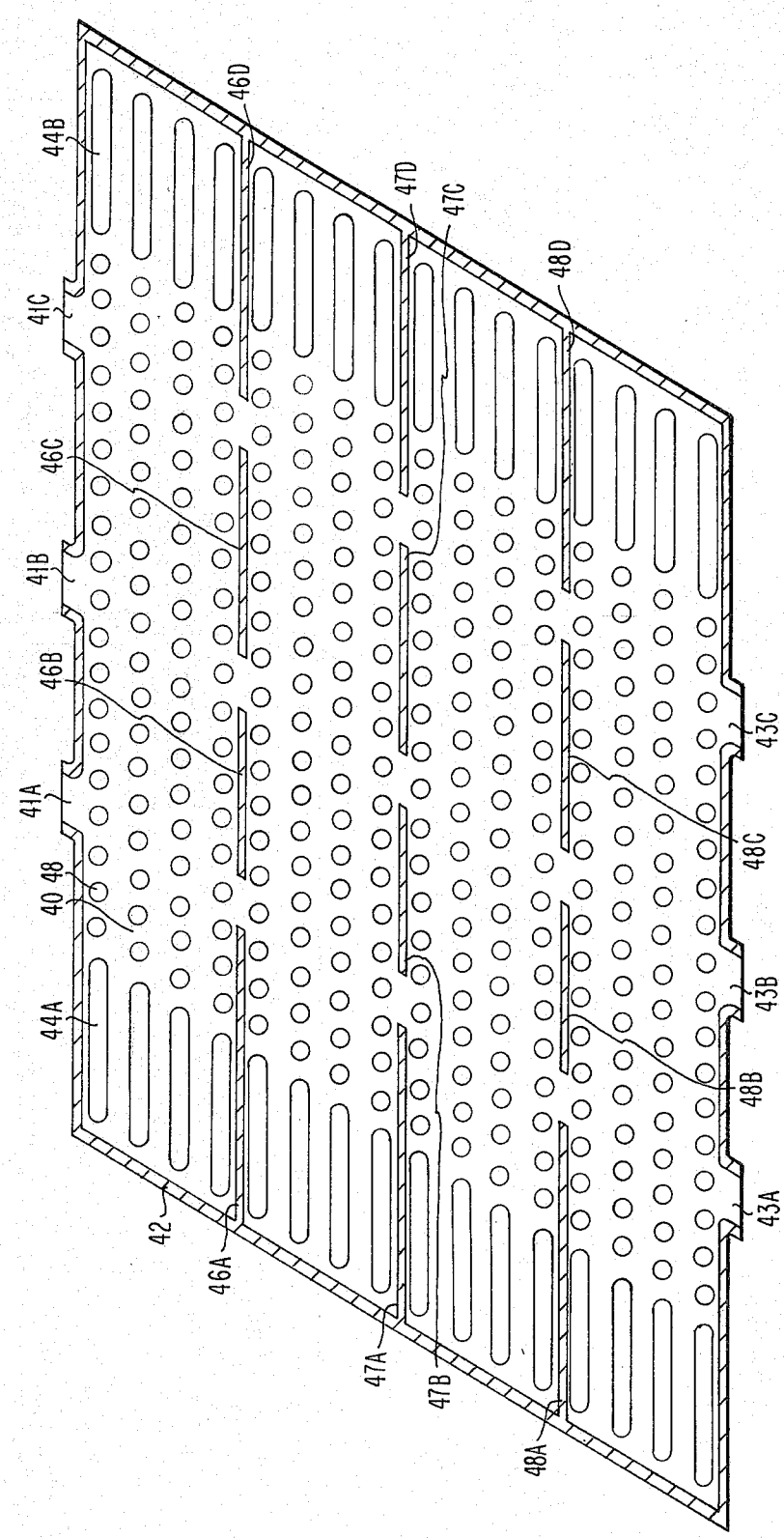
FIG. 4 is a top view of a lattice containing stripe domains and bubble domains with barriers positioned every fourth row and with openings in the barriers for the columns which access to the input and output ports.

FIG. 4 illustrates a preferred embodiment of this invention. A lattice 40 is confined by retaining means 42. Openings in the retaining means 42 are provided for input ports 41A, 41B and 41C as well as output ports 43A, 43B and 43C. The lattice contains a column of stripe domains 44A at one end of the lattice and a second column of stripe domains 44B at the other end of the lattice. Positioned between the column of stripe domains 44A and the stripe domains 44B are columns of bubble domains 48. Each row in the lattice contains a stripe domain 44A, a row of bubbles 48 and a stripe domain 44B. In FIG. 4 bubble lattice 40 has a barrier 46A, 46B, 46C and 46D positioned below the fourth row of stripe domains and bubble domains. Barriers 47A, 47B, 47C and 47D is positioned below the eight row of stripe domains and bubble domains. Barriers 48A, 48B, 48C and 48D are positioned below the twelfth row of stripe domains and bubble domains. Barriers 46A, 47A and 48A are separated from barriers 46B, 47B and 48B by a column accessing channel connected to input port 41A and ouput port 43A. Barrier 46B, 47B and 48B are separated from barrier 46C, 47C and 48C by a column accessing channel connected to input port 41B and output port 43B. Barriers 46C, 47C and 48C are separated from barrier 46D, 47D and 48D by a column accessing channel connected to input port 41C and output port 43C.

In certain applications this lattice 40 arrangement containing barriers every fourth row is very effective in providing many improved characteristics for such a lattice. The barriers on both sides of the column accessing channels provide sufficient rigidity or lattice integrity for the columns of bubbles adjacent the column accessing channel.

It has also been found that this configuration readily yields the desired number of rows of stripes and bubble domains, for example, in this case 16 rows. The material specifications can vary over a wider range and still 16 rows can be obtained. Without the three rows of barriers the material composition would have to be more closely controlled in order to obtain 16 rows. With the structure it is possible to obtain 16 rows on material compositions which yielded either more than or less than 16 rows when there were no barriers present in the lattice.

The barriers which were dams having a thickness thicker than the remaining film, also reduced or eliminated the curling of the stripe domains as well as any possible swaying effect of bubbles.

Figure 5:
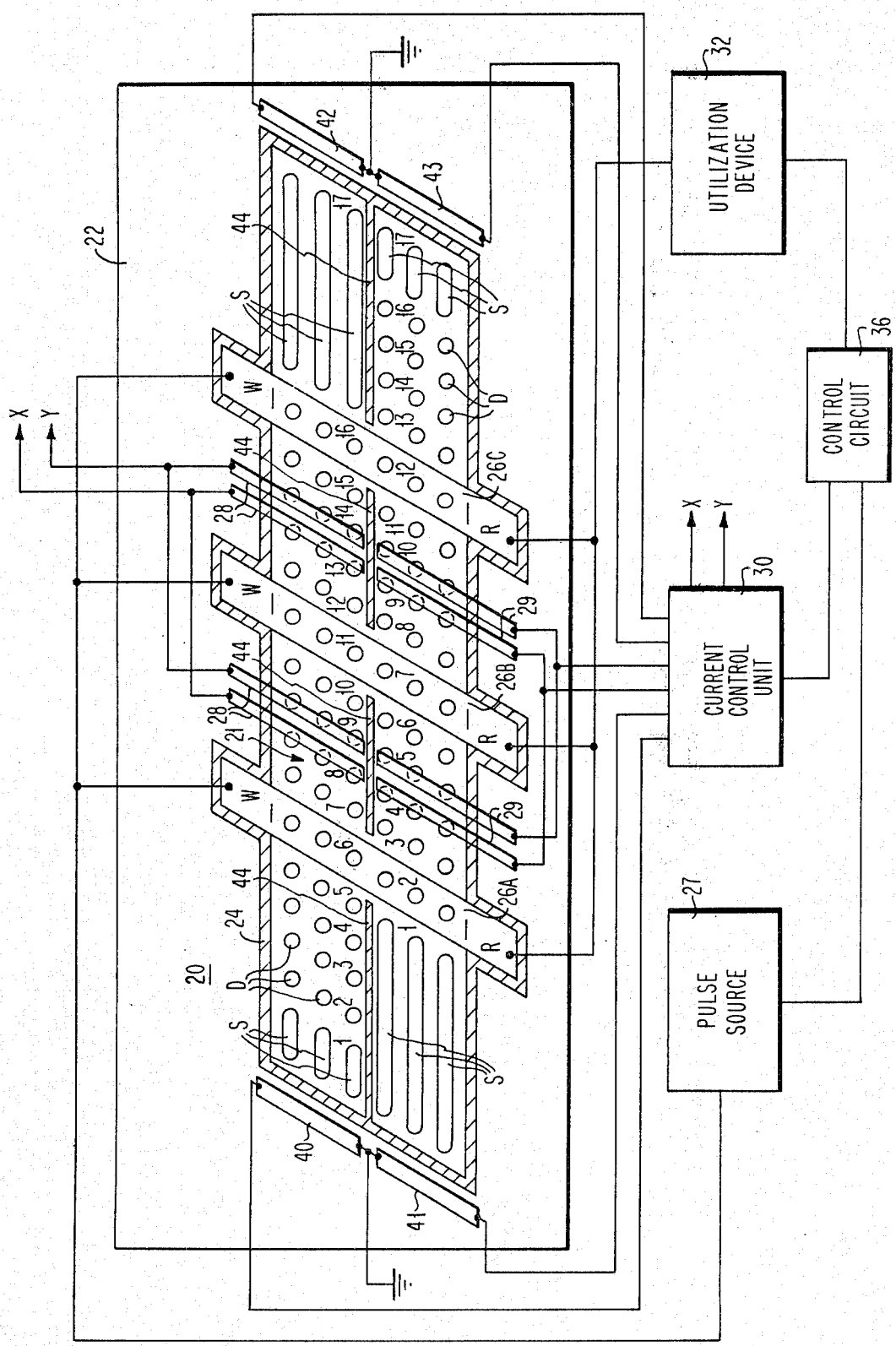
FIG. 5 shows a bubble domain lattice arrangement embodying the stripe domain buffer sections at each end.

The adaption of the apparatus according to the present invention for inducing translations of bubble domains in a preferred embodiment of an information store is shown in FIG. 5. FIG. 5 shows a detailed diagram of bubble domain arrangement 20 formed on a suitable medium 22 for supporting bubble domains. Medium 22 can comprise any of the well-known materials permitting bubble domain propagation including rare-earth orthoferrites and garnets.

The bubble domain arrangement 20 in FIG. 5 includes a lattice 21 comprising six rows of domains with each row having seventeen domains, fifteen circular information storing bubble domains D hereinafter called bubble domains and two elongated bubble domains S hereinafter called stripe domains. The domains are contained within an enclosure means, guide rail 24, which surrounds the entire lattice 21. Guide rail 24 prevents the domains from escaping the lattice 21 and along with the interactive forces between domains provides the lattice integrity.

Three column accessing devices 26 A-C are shown, each comprising a write means W, such as a nucleating and encoding device, and a sensing or reading means R, such as a magneto-resistive sensor. An example of a column accessing device usable with the preferred embodiment of the present invention, as shown in FIG. 5, is given in copending U.S. patent application Ser. No. 429,601 filed on Jan. 1, 1974, and assigned to the assignee of the present invention. Reference is herein made to patent application Ser. No. 429,601 for complete description for inclusion in the present application.

For the purposes of this description, column accessing devices 26 A-C insert and remove bubble domains D from the lattice 21 in a direction substantially transverse to the direction of domain propagation by the lattice. The bubble domains D are propagated in a horizontal direction in the plane of FIG. 5 into the column accessing devices 26 A-C by progapation means such as propagation conductors 28 and 29 supported by the means elongating and contracting the stripe domains S, all under control of a progagation current control unit 30 and grounded by means not shown. Six bubble domains of any one column located in a column accessing device can be moved transverse to the progagation direction by separate bubble domain movement means either propagation conductors or a bubble pump shift register (neither shown), as described in the aforementioned patent application Ser. No. 429,601. After detection of the removed bubble domains and transmittal of the information sensed to a utilization device 32, new bubble domains having the same or different information state can be inserted into the same column of the bubble domains by the write means W under control of a pulse source 27, or the same bubble domains can be returned to the lattice by reversing the movement direction of the bubble domains in any column accessing device. Any one of the column accessing devices 26 A-C can be actuated to sense one column of bubble domains or several devices 26 A-C can be actuated at one time to sense several columns of bubble domains.

The control of the propagation conductors 28 and 29 is accomplished in the well-known manner by the propagation current control unit 30. The control of the sequences of operation for the pulse source 27, the propagation current control unit 30, and the utilization device 32 is under control of a control circuit means 36. The control circuit 36 controls the operation to form the bubble domain according to the data required, to propagate the correct column of bubble domains into the closest column accessing device and then out of the column accessing device 26 A-C for sensing and utilization when retrieval is required. The various means and circuits so far described for FIG. 5 may be any such element capable of operating in accordance with this invention.

Still referring to FIG. 5, the domain arrangement 20 is characterized by the formation of the stripe domains S at each end of the lattice 21 as a buffer section by elongating and contracting in accordance with changing magnetic field patterns developed by buffer conductors 40-43 placed adjacent to the ends of the lattice 21 outside of the guide rail 24. As will be discussed later for FIG. 6, the buffer conductors generate a field gradient affecting the size of the stripe domains S according to the electrical current patterns applied to each buffer conductor by the propagation current control unit 30.

As shown in FIG. 5, the buffer conductors 40-43 each affect three rows of domains within the lattice. It should be obvious that the buffer conductors each may be individual conductors controlling the size of the stripe domains S for each row of bubble domains, or can comprise any combination as desired by the particular application. For instance in FIG. 5, the first three rows are controlled by buffer conductors 40 and 42 formed on each end of the top portion of the lattice 21. Buffer conductors 41 and 43 on each end of the lower portion of the lattice 21 control the last three rows of bubble domains. The progapation current control unit 30 adjusts the current such that the buffer conductor 40 contracts the stripe domain at the left-top portion of FIG. 5 while the buffer conductor 42 elongates the stripe domains at the to-right portion of FIG. 5 when a translation of the bubble domain D to the left is required. The current in the propagation conductors 28 are sequenced, as required, to propagate the bubble domains.

The reverse situation is shown for the lower three rows such that the propagation current control unit 30 actuates the buffer conductor 41 such that the stripe domains elongate on the lower left portion of the lattice and actuates the buffer conductor 43 such that the stripe domains contract on the lower right hand portion by appropriately controlling the current in each translation conductor. Likewise the current in propagation conductors 29 is sequenced to propagate the bubble domains. A suitable barrier or bubble domain interaction prevention means, interaction line 44 such as a sputter etched groove, is provided between each group of three rows of bubble domains to prevent the change of interaction action between adjacent stripe and circular domains during individual propagation from affecting the orderly control of the lattice.

The enclosure means of the lattice 20 of FIG. 5 such as guide rails 24 and the barrier or interaction line 44 can comprise any of the well known means for controlling the positioning of bubble domains such as by providing a high energy boundary for the bubble domains. Structures to provide high energy boundaries can be fabricated from current carrying conductors and magnetic materials. Also, changes in the magnetic properties of the bubble domain material can be used. Such changes include thickness changes such as a sputter etched groove and changes brought about by ion implantation, diffusion, etc. The sputter etched groove used and discussed herein for the guide rails 24 and the barrier or interaction line 44 of the preferred embodiment should not be taken as limiting this invention.

In FIG. 5 the bubble domains of column number 6 of the first three rows is shown positioned into the column accessing device 26A while the bubble domains of column number 2 of the last three rows are positioned in the same column accessing device 26A. Thus, different rows and columns of bubble domains can be intermixed and then sensed by actuating the column accessing device. This feature would be particularly useful in the modification of instruction words stored in an information storage device wherein the high order bits need to be modified at will to control the entry of a computer program into different sections of the memory store.

There are several types of translation or buffer conductors that can be used in accordance with the present invention. One type is shown in FIG. 6.

FIG. 6 illustrates the working principle of a serpentine current carrying buffer conductor 46 formed on one side of the lattice array. The buffer conductor 46 spatially modulates a bias field along a column direction A. The domains of the end column number 1 thus form stripe domains and position themselves at locations of minimum field value. On increasing the drive current I, the bias field decreases at these locations and the stripe domains S of the end column 1 elongate along the direction B of the arrow, which is the direction of the desired bubble domain D translation. The pressure of the elongation of the stripe domain of the end column number 1 on the adjacent bubble domains in their rows cause a translation pressure in the direction B. At the same time, buffer conductors at the other end of the same rows contract the end stripe domain relieving some of the translation pressure caused by an elongation of the stripe domains in column 1. A practical limitation of the buffer conductors 46 shown in FIG. 6 arises from the fact that the period of serpentine conductor pattern has to be equal to the spacing between bubble domain centers in the lattice, distance C. This is, the width of the serpentine buffer conductor 46 must be roughly one-fourth of the lattice spacing. The practical limit for the conductor width at present is approximately 2um, since at present any lesser conductor width becomes difficult to fabricate by present data photolithographic processes.

It has been further discovered that it is not necessary to use a drive field amplitude modulated along the direction of the arrow A. A regular stripe domain pattern occurs in a lattice because of magnetostatic interactions between the stripe domains themselves. Stripe domain lengths can thus be controlled with a straight conductor placed parallel along the direction of the arrow A. In FIG. 6 the defined orientation of the stripe domains and the interface between stripes and the bubble lattice is accomplished through the serpentine buffer conductor 46.

Although several embodiments of this invention have been described, it is understood that numerous variations may be made in accordance with the principles of this invention.

I claim:
1. A bubble lattice system comprising
   a plurality of substantially parallel rows of movable domains, said domains adapted to move from a first position to a second position in said row, and
   a barrier positioned between two of said rows wherein said barrier maintains the relative position of said domains in said two rows adjacent said barrier as said domains move from said first position to said second position.
2. A bubble lattice system as described in claim 1 wherein said rows contain stripe domains.
3. A bubble lattice system comprising
   a plurality of substantially parallel rows containing movable bubble domains, said bubble domains adapted to move from a first position to a second position is said row, and
   a barrier positioned between two of said rows wherein said barrier maintains the relative position of said bubble domains in said two rows adjacent said barriers said bubble domains move from said first position to said second position.
4. A combination for maintaining the integrity of a bubble domain lattice having an enclosed plurality of bubble domains in rows and columns on a medium supporting bubble domains, said combination comprising:
   a column of stripe domains established on each end of the lattice, one pair for each row of bubble domains in the lattice;
   adjusting means for expanding and contracting, at opposite ends, the length of each pair of said stripe domains in accordance with the required propagation direction of its row of bubble domains, and
   a barrier located between two rows of domains for preventing interaction forces between domains in rows adjacent said barrier.
5. A bubble lattice system as described in claim 3 wherein said barrier is a dam.

6. A bubble lattice system as described in claim 3 wherein the length of said barrier is a portion of the length of said rows.

7. A bubble lattice system as described in claim 3 wherein said barrier is positioned at the end of said rows.

8. A bubble lattice system as described in claim 3 wherein said barrier is positioned at a distance away from the ends of said rows.

9. A bubble lattice system as described in claim 3 wherein said barrier is a groove.

10. A bubble lattice system as described in claim 9 wherein said groove contains domains.

11. A bubble lattice system comprising
a plurality of substantially parallel rows containing movable bubble domains, said bubble domains adapted to move from a first position to a second position is said row, and
a plurality of barriers in said system wherein said barriers maintain the relative position of said bubble domains in said rows adjacent said barriers as said bubble domains move from said frist position to said second position.

12. A bubble lattice system as described in claim 11 wherein one barrier is positioned every 1 to 16 rows.

13. A bubble lattice system as described in claim 12 wherein one barrier is positioned every 1 to 4 rows.

14. A bubble lattice system as described in claim 11 wherein a first barrier and a second barrier are positioned in an end relationship between 2 rows,
one end of said first barrier spaced at least a distance of one bubble diameter from one end of said second barrier.

* * * * *